United States Patent
Li et al.

(10) Patent No.: US 11,004,600 B2
(45) Date of Patent: May 11, 2021

(54) PERMANENT MAGNET AND METHOD OF MAKING PERMANENT MAGNET

(71) Applicant: FORD GLOBAL TECHNOLOGIES, LLC, Dearborn, MI (US)

(72) Inventors: Wanfeng Li, Novi, MI (US); Feng Liang, Troy, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 270 days.

(21) Appl. No.: 16/012,411

(22) Filed: Jun. 19, 2018

(65) Prior Publication Data

US 2019/0385789 A1 Dec. 19, 2019

(51) Int. Cl.
| | |
|---|---|
| *H01F 41/02* | (2006.01) |
| *H01F 1/057* | (2006.01) |
| *H01F 7/02* | (2006.01) |
| *C21D 1/04* | (2006.01) |
| *C30B 30/04* | (2006.01) |
| *C30B 33/04* | (2006.01) |
| *C21D 6/00* | (2006.01) |

(52) U.S. Cl.
CPC .......... *H01F 41/0253* (2013.01); *C21D 1/04* (2013.01); *C21D 6/007* (2013.01); *C30B 30/04* (2013.01); *C30B 33/04* (2013.01); *H01F 1/0573* (2013.01); *H01F 1/0577* (2013.01); *H01F 7/02* (2013.01)

(58) Field of Classification Search
None
See application file for complete search history.

(56) References Cited

U.S. PATENT DOCUMENTS

| | | | |
|---|---|---|---|
| 6,011,475 A | 1/2000 | Herzer | |
| 6,491,765 B2 | 12/2002 | Okayama et al. | |
| 6,830,634 B2 | 12/2004 | Herzer et al. | |
| 2013/0248754 A1 | 9/2013 | Sakuma et al. | |
| 2016/0093425 A1* | 3/2016 | Li | B22F 3/02 |
| | | | 419/30 |

FOREIGN PATENT DOCUMENTS

CN 203144559 U 8/2013

OTHER PUBLICATIONS

Zhang (J. Phys. D: Appl. Phys., 2016, vol. 49, No. 455002). (Year: 2016).*
Boothry (J.of Appl. Phys. 1958, vol. 29, No. 3). (Year: 1958).*
Nguyen et al., "Enhancement of exchange coupling interaction of NdFeB/MnBi hybrid magnets", Physica B 532 (2018) pp. 130-134, Elsevier, www.elsevier.com/locate/physb.

\* cited by examiner

*Primary Examiner* — Xiaowei Su
(74) *Attorney, Agent, or Firm* — David B Kelley; Brooks Kushman P.C.

(57) ABSTRACT

A method includes mixing first and second alloys to form a mixture, pressing the mixture within a first magnetic field to form a magnet having anisotropic particles of the first alloy aligned with a magnetic moment of the magnet, and heat treating the magnet within a second magnetic field to form elongated grains from the second alloy and align the elongated grains with the moment.

13 Claims, 5 Drawing Sheets

PERMANENT MAGNET AND METHOD OF MAKING PERMANENT MAGNET

TECHNICAL FIELD

The present disclosure relates to permanent magnets and methods of making permanent magnets.

BACKGROUND

Neodymium-iron-boron (Nd—Fe—B) alloy magnets have been utilized in permanent magnet electric machines, such as motors, generators, or combination motor/generators. In order to meet the high temperature demand for operation of a permanent magnet electric machine, especially electric machines used in electric and hybrid vehicles, high temperature stability of the permanent magnets is desired. However, the coercivity of the Nd—Fe—B magnets decreases with increasing temperature. Coercivity is the ability of a magnet to withstand an external magnetic field without becoming demagnetized.

SUMMARY

A method includes mixing a Mn—Bi alloy with a Nd—Fe—B alloy powder having Nd—Fe—B anisotropic particles to form a mixture, pressing the mixture within a first magnetic field to form a magnet having Nd—Fe—B anisotropic particles aligned with a magnetic moment of the magnet, and annealing the magnet within a second magnetic field to form elongated Mn—Bi grains and align the elongated Mn—Bi grains with the moment.

A method includes mixing first and second alloys to form a mixture, pressing the mixture within a first magnetic field to form a magnet having anisotropic particles of the first alloy aligned with a magnetic moment of the magnet, and heat treating the magnet within a second magnetic field to form elongated grains from the second alloy and align the elongated grains with the moment.

A permanent magnet includes Nd—Fe—B anisotropic particles and MnBi LTP grains aligned in a direction of a magnetic moment of the permanent magnet, wherein the MnBi LTP grains have a length to width ratio that is at least 3:2.

DETAILED DESCRIPTION

Embodiments of the present disclosure are described herein. It is to be understood, however, that the disclosed embodiments are merely examples and other embodiments may take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures may be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
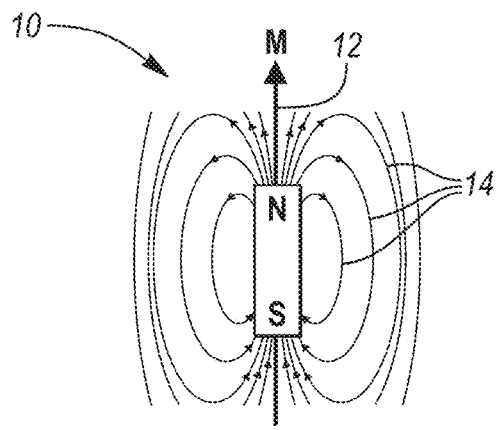
FIG. 1 illustrates a permanent magnet.

Referring to FIG. 1, a permanent magnet 10 is illustrated. The permanent magnet 10 may be representative of any of the permanent magnets described herein. The permanent magnet 10 has a magnetic moment 12 that represents the magnetic strength and orientation of the permanent magnet 10. More specifically, the magnetic moment 12 represents the magnetic dipole moment that extends from the South to the North pole of a Magnet. The magnetic moment 12 may be defined in terms of torque that an object experiences in a magnetic field. More specifically, the toque on an object having a magnetic moment is equal to the magnetic moment multiplied by the strength of the magnetic field. The magnetic field of the permanent magnet 10 illustrated in FIG. 1 is represented by lines 14.

As previously stated, the coercivity of the Nd—Fe—B permanent magnets decreases with increasing temperature. In order to stabilize the permanent magnet for high temperature applications, and to increase the coercivity of the Nd—Fe—B permanent magnets at higher temperatures, heavy rare earth elements, such as dysprosium (Dy) and terbium (Tb), may be added into Nd—Fe—B permanent magnets. The addition of such heavy rare earth elements, however, increases the cost of producing Nd—Fe—B permanent magnets due to the scarcity and much higher cost of the heavy rare earth elements. Alternatively, the stability and coercivity of Nd—Fe—B permanent magnets at higher temperatures may be increased by mixing Nd—Fe—B alloys with other alloys that do not incorporate rare earth elements, such as MnBi low temperature phase (LTP), which has a coercivity that increases as temperature increases (i.e. MnBi LTP has a positive temperature coefficient). By modulating the weight ratio and the processing parameters of such a hybrid Nd—Fe—B/Mn—Bi permanent magnet, the temperature coefficient of the hybrid permanent magnet may be adjusted to increase the coercivity at higher temperatures.

Figure 2A:
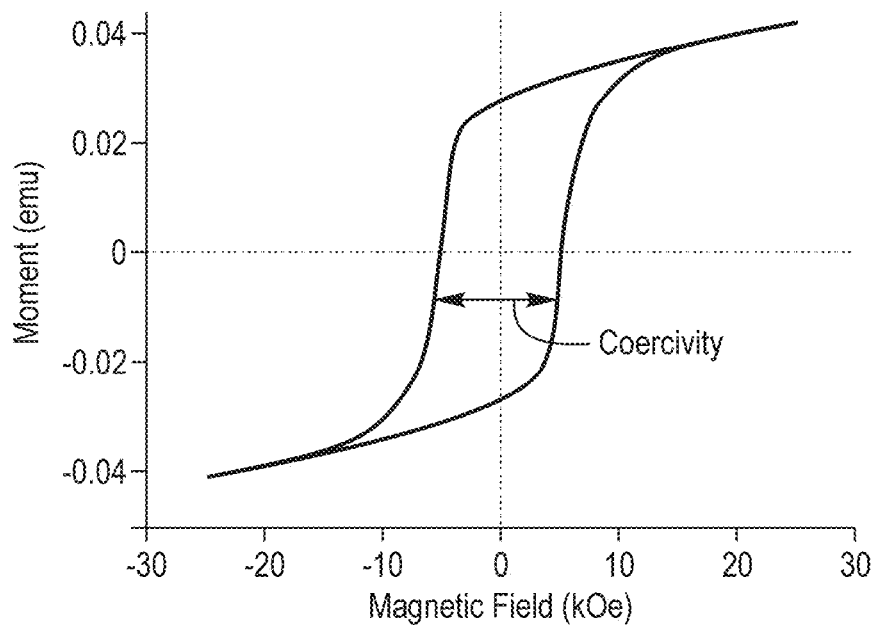
FIGS. 2A and 2B illustrate the magnetic hysteresis loop of Mn—Bi before and after annealing.
Figure 2B:
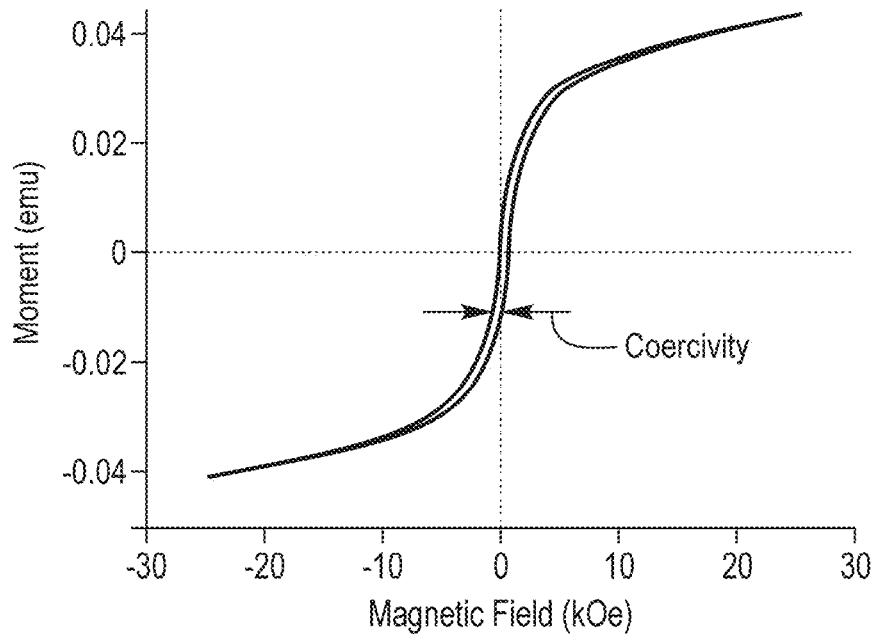

The Mn—Bi alloy may be prepared through various techniques (e.g., by a melting process) followed by an annealing process (i.e., heat treating process). The prepared Mn—Bi alloy is then mixed with Nd—Fe—B powders followed by various other processes to produce a hybrid Nd—Fe—B/Mn—Bi permanent magnet. The properties of the prepared Mn—Bi alloy are dependent on the microstructure of the Mn—Bi alloy, especially the grain sizes. The annealing process increases the volume ratio of MnBi LTP, which is the permanent magnetic phase of Mn—Bi alloys, that contributes to the magnetic properties of the Nd—Fe—B/Mn—Bi permanent magnet. However, the annealing process also increases the grain size of MnBi LTP. As a result of increasing the grain size, the coercivity of the prepared Mn—Bi magnet would be significantly decreased. See FIG. 2A, which illustrates the magnetic hysteresis loop of Mn—Bi alloys before annealing, and FIG. 2B, which illustrates the magnetic hysteresis loop Mn—Bi alloys (i.e., the MnBi LTP alloy) after annealing. The coercivity is significantly decreased in FIG. 2B relative to FIG. 2A (i.e., the coercivity is decreased after the Mn—Bi alloy has been annealed and the amount of MnBi LTP having large grain sizes has been increased).

The grain size of the annealed Mn—Bi alloy (i.e., the MnBi LTP alloy) may be decreased through milling (e.g., ball milling, jet milling, cryo-milling, etc.) or other pulverization techniques, resulting in increasing the coercivity of the MnBi LTP alloy, before the MnBi LTP alloy (in powder form) is mixed with the Nd—Fe—B alloy powder. Decreasing the grain size of the annealed of the MnBi LTP alloy by milling or other pulverization techniques, however, also changes the characteristics of the MnBi LTP alloy grains such that the MnBi LTP alloy grains are polycrystalline and isotropic, which do not possess the ability to be aligned in a magnetic field, due to the symmetrical shape of isotropic grains.

Figure 3:
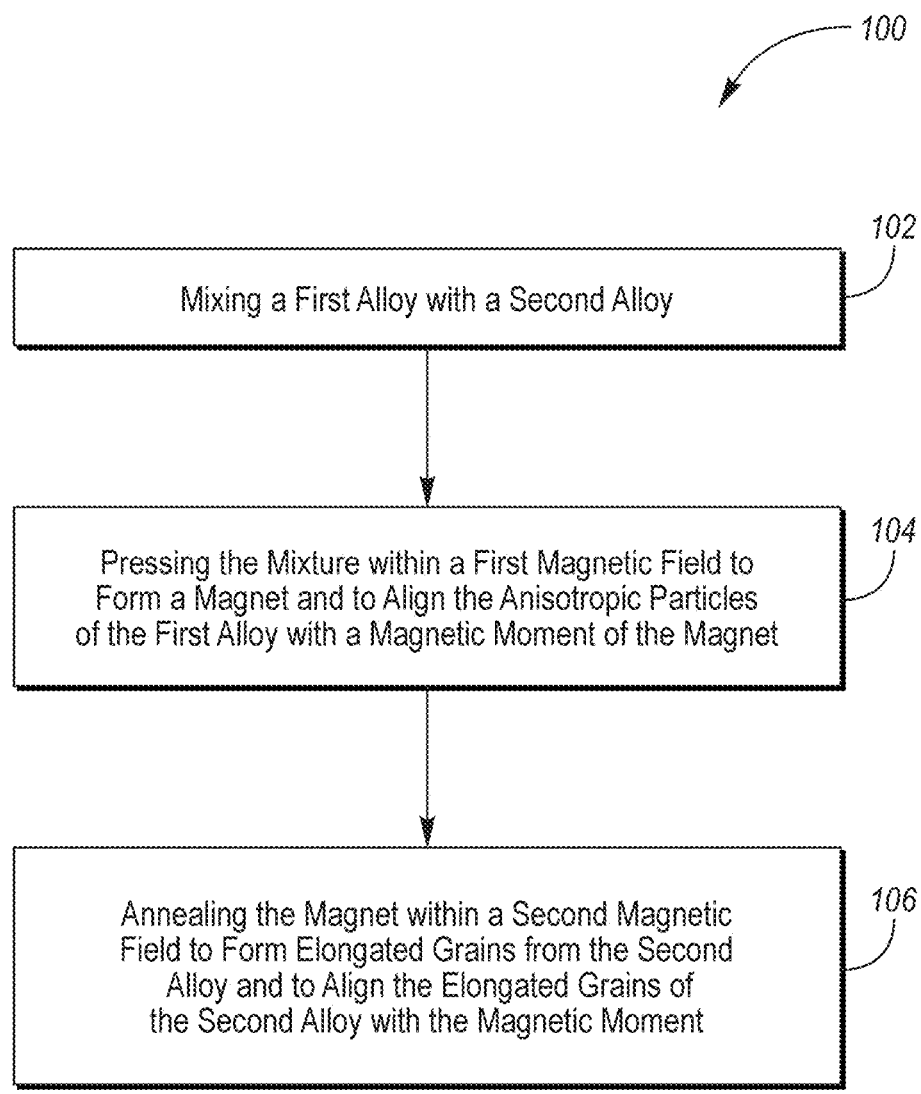
FIG. 3 is a flowchart illustrating a method of making a permanent magnet from a first alloy and a second alloy.

Referring to FIG. 3, a flowchart of a method 100 of making a permanent magnet from a first alloy and a second alloy is illustrated. The method 100 begins at block 102 where a first alloy is mixed with a second alloy to form a mixture. The weight ratio of the first alloy to the second alloy within the mixture may range from 10:1 to 1:10. More specifically, the first alloy may be a Nd—Fe—B alloy and the second alloy may be a Mn—Bi alloy. The Nd—Fe—B alloy may be any type of Nd—Fe—B alloy, such $Nd_2Fe_{14}B$. The Nd—Fe—B alloy may also contain other elements, such as Pr, Dy, Tb, Cu, Al, Ga, et al. The Mn—Bi alloy may be any type of Mn—Bi alloy, such as MnBi, and can be alloyed with other elements. The first alloy (e.g., Nd—Fe—B) may be in a powder form and is preferably an anisotropic hydrogenation disproportionation desorption recombination (HDDR) powder during the mixing step at block 102.

Prior to mixing the first and second alloys at block 102, the second alloy (Mn—Bi alloy) may be prepared by melting or sintering and mixing the different elements (e.g., Mn and Bi) with a preferred molar ratio of approximately 1:1. The melting process may be any type of melting process, such as an arc melting process. After the melting or sintering process, the second alloy may be melt spun into a ribbon or directly milled into a powder. The second alloy may also be annealed prior to be spun into a ribbon or directly milled into a powder, or milled into powder after annealing. If the second alloy is melt spun and is a Mn—Bi alloy, the Mn—Bi alloy ribbon produced by the melt spinning process will contain a very little amount of the MnBi LTP alloy, with very small grain size. After the melt spinning process, the second alloy ribbon (e.g., Mn—Bi alloy ribbon) may then be milled (e.g., ball milling, jet milling, cryo-milling, etc.) into a powder. The second alloy ribbon or second alloy powder (which may be the powder created from milling the second alloy directly after the melting or sintering process, the powder created from milling the melted or sintered second alloy after an annealing process, or the powder created from milling the second alloy ribbon after the melting spinning process) is then mixed with the first alloy powder at block 102.

Once the first and second alloys are mixed at block 102, the method 100 moves on to block 104, where the mixture is pressed within a die or mold, and within a first magnetic field, to form a permanent magnet. More specifically, anisotropic particles and/or grains of the first and second alloys are aligned with the first magnetic field, and ultimately with a magnetic moment of the formed permanent magnet, during the pressing process to form the permanent magnet. The die or mold of the pressing operating may be adjusted to a desired temperature. More, specifically, the pressing operation may be performed at a temperature that is sufficiently hot enough to support the forming process of the permanent magnet while at the same time being less than the Curie temperature (i.e., the temperature at which or above a material loses it permanent magnetism characteristics) of the first alloy to ensure that the anisotropic particles and/or grains of the first alloy become aligned within the first magnetic field. Increasing the temperature during the pressing operation may lead to increased density of the formed permanent magnet. Alternatively, the mixture may be first pressed at room temperature within the first magnetic field, followed by a second pressing operation that is conducted at an increased temperature and outside of a magnetic field to support the forming process.

At Block 104, if the first alloy is a Nd—Fe—B alloy, the pressing operation may be performed at temperature that is less than 310° C., 310° C. being the Curie temperature of the Nd—Fe—B alloy. It should be noted that all temperature related characteristics (e.g., Curie temperature, melting point, etc.) of the materials listed herein refer to temperature characteristics at a pressure of one atmosphere, unless otherwise stated herein. More preferably, however, if the first alloy is a Nd—Fe—B alloy, the pressing operation may be performed at temperature of 300° C. or less. It should also be noted that if the second alloy is a Mn—Bi alloy that has not been annealed at block 104, the Mn—Bi ribbon or powder will be polycrystalline in structure (i.e., isotropic) and contain very little amount of magnetic MnBi LTP. Therefore, the particles and/or grains of the Mn—Bi alloy will unlikely become aligned in the first magnetic field and establish permanent magnet qualities. However, if the second alloy is a Mn—Bi alloy that has been annealed and milled to achieve single crystalline structure or anisotropic MnBi LTP particles, the second alloy may also become aligned within the first magnetic field during the pressing operation within the first magnetic field.

Once the first and second alloys are pressed to form a permanent magnet, the method 100 moves on to block 106, where the formed permanent magnet is annealed or heat treated within a second magnetic field to form elongated grains from the second alloy (or more specifically to form elongated grains from the phase of the second alloy that exhibits properties of a permanent magnet, e.g., MnBi LTP). The elongated grains of the second alloy become elongated or "grow" within the direction of the second magnetic field during the annealing process. Therefore, the elongated grains of the second alloy become aligned with the second magnetic field, and ultimately with the magnetic moment of the formed permanent magnet, during the annealing process within the second magnetic field. It should be noted that the process of annealing or heat treating an alloy within a magnetic field may also be referred to as magnetic field annealing. The formed permanent magnet may more specifically be annealed in the second magnetic field in a vacuum furnace or protective atmosphere. The second magnetic field will be applied to the formed permanent magnet in the same direction that the first magnetic field was applied to the mixture at block 104, such that the elongated grains of the second alloy align with both the magnetic moment of the formed permanent magnet and the anisotropic particles and/or grains of the first alloy that were aligned at block 104.

The formed permanent magnet may be annealed at a temperature that is greater than the Curie temperature of the first alloy so as to not disturb the alignment of the anisotropic particles and/or grains of the first alloy that occurred at block 104. The formed permanent magnet may also be annealed at temperature that is less than the Curie temperature of the second alloy so that the elongated grains formed from the second alloy during the annealing process become aligned within the second magnetic field. The formed permanent magnet may be annealed for a duration that ranges from 5 min to 4 hours.

At Block 106, if the first alloy is a Nd—Fe—B alloy and the second alloy is a Mn—Bi alloy, the annealing process is performed at temperature that is equal to or greater than the Curie temperature of the Nd—Fe—B alloy but less than the Curie temperature of the Mn—Bi alloy. The Curie temperature of the Mn—Bi alloy is approximately 447° C. Preferably, the annealing process is performed at a temperature that ranges from 270° C. to 400° C. Also at block 106, if the second alloy is a Mn—Bi alloy, the elongated grains formed from the Mn—Bi alloy comprise MnBi LTP material, which is desirable since MnBi LTP is the phase of Mn—Bi alloys that exhibits the properties of permanent magnets.

Figure 4A:
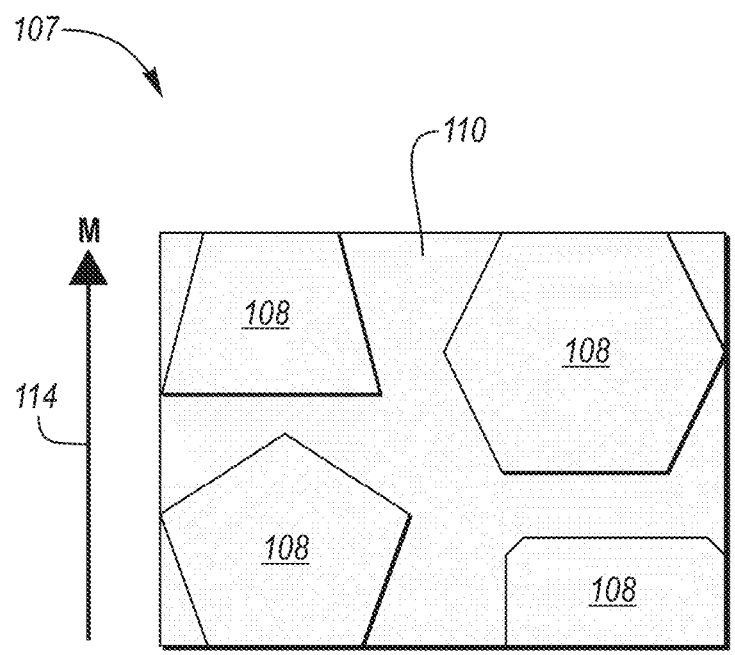
FIGS. 4A and 4B illustrate the effects of annealing a Nd—Fe—B/Mn—Bi permanent magnet within a magnetic field.
Figure 4B:
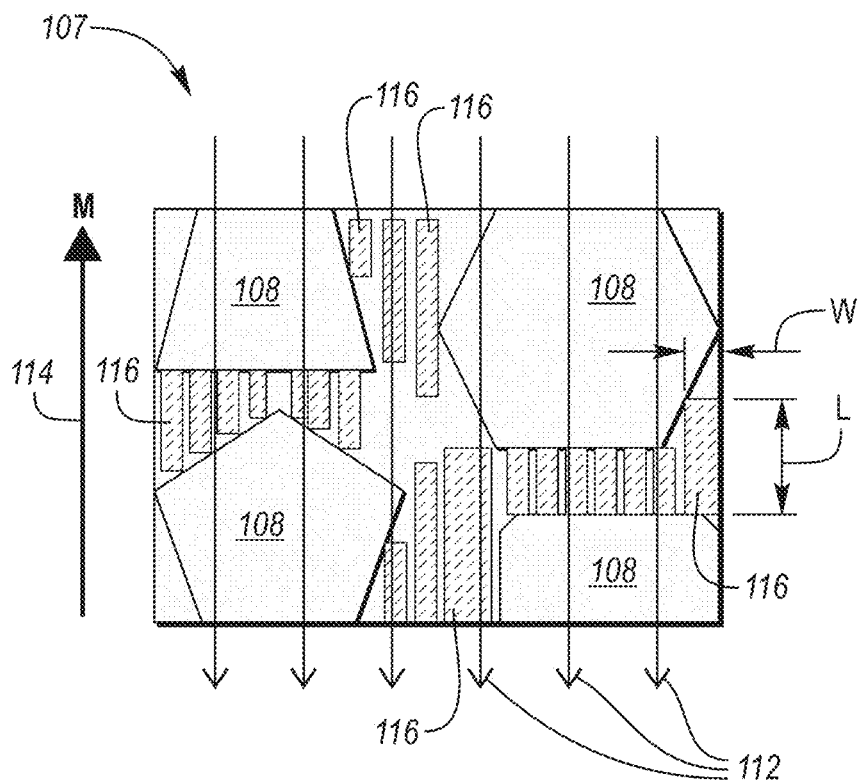

Referring to FIGS. 4A, and 4B, effects of annealing the formed permanent magnet 107 within the second magnetic field are illustrated. FIG. 4A illustrates anisotropic particles and/or grains 108 of the first alloy (which may be a Nd—Fe—B alloy) in a matrix 110 of the second alloy (which may be a Mn—Bi alloy). More specifically, the second alloy in FIG. 4A is comprised of randomly oriented magnetic grains (not shown) since the annealing process has not yet occurred (i.e., FIG. 4A is a representation of the permanent magnet after block 104 where the mixture is pressed, but prior to the annealing process at block 106). FIG. 4B illustrates the application of the second magnetic field 112 relative to the magnetic moment 114 of the permanent magnet and the effect of the magnetic field annealing process on the second alloy. During the magnetic field annealing process elongated grains 116 (which may be comprised of MnBi LTP) are formed from the second alloy. The elongated grains are anisotropic. More specifically, the elongated grains 116 elongate or "grow" (i.e., increase in length) and become aligned in the direction of the second magnetic field 112 during the magnetic field annealing process at block 106. The elongated grains 116 also become aligned with the anisotropic particles and/or grains of the first alloy and the magnetic moment 114 of the formed permanent magnet 107 during the magnetic field annealing process. The duration of the annealing process, along with the application of the second magnetic field 112 to the formed magnet 107, may be increased to increase the length of elongated grains 116 in the direction of the second magnetic field 112, and ultimately the magnetic moment 114 of the formed permanent magnet 107, or may be decreased to decrease the length of the elongated grains 116 in the direction of the second magnetic field 112, and ultimately the magnetic moment 114 of the formed permanent magnet 107. Once the annealing process is completed at block 106, a ratio of the length L of the elongated grains 116 to a width W of the elongated grains may range from 3:2 to 100:1.

If the first alloy is a Nd—Fe—B alloy and the second alloy is a Mn—Bi alloy, the elongated grains 116 will be comprised of MnBi LTP. During the magnetic field annealing process at block 106, the bismuth of the Mn—Bi alloy will become melted (bismuth having a melting point of approximately 271.4° C.), allowing the MnBi LTP grains to be aligned in the second magnetic field. The growth of the grains is anisotropic due to the contribution of magnetic free energy. The elongated grains 116 may decrease the magneto static energy and increase the stability of the permanent magnet 107. The MnBi LTP grains will agglomerate along their easy axis and form the elongated grains 116 that align with the magnetic moment 114 of the formed permanent magnet 107. Additionally, setting the annealing temperature at or above the Curie temperature of the Nd—Fe—B alloy prevents the stray field from Nd—Fe—B particles from impacting the alignment procedure of the MnBi LTP grains. The elongated grain shape increases the coercivity of the MnBi LTP grains and changes the magnetic field distribution around the grains, which increases the overall coercivity of the formed magnet 107. The formed magnet 107 may be referred to as a Nd—Fe—B/Mn—Bi hybrid magnet when the first alloy is a Nd—Fe—B alloy and the second alloy is a Mn—Bi alloy.

Figure 5A:
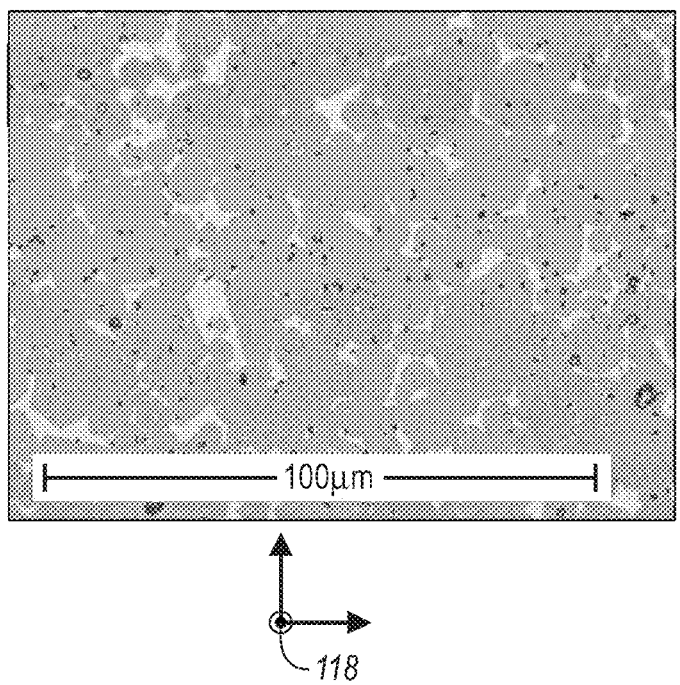
FIGS. 5A, 5B, and 6 are grayscale images that illustrate an example of the grain structure of a Mn—Bi alloy produced during experimental magnetic field annealing.
Figure 5B:
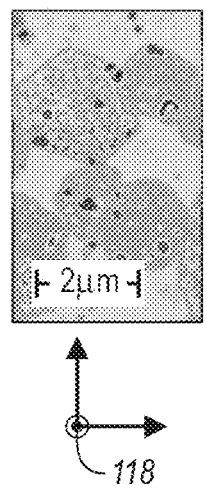
Figure 6:
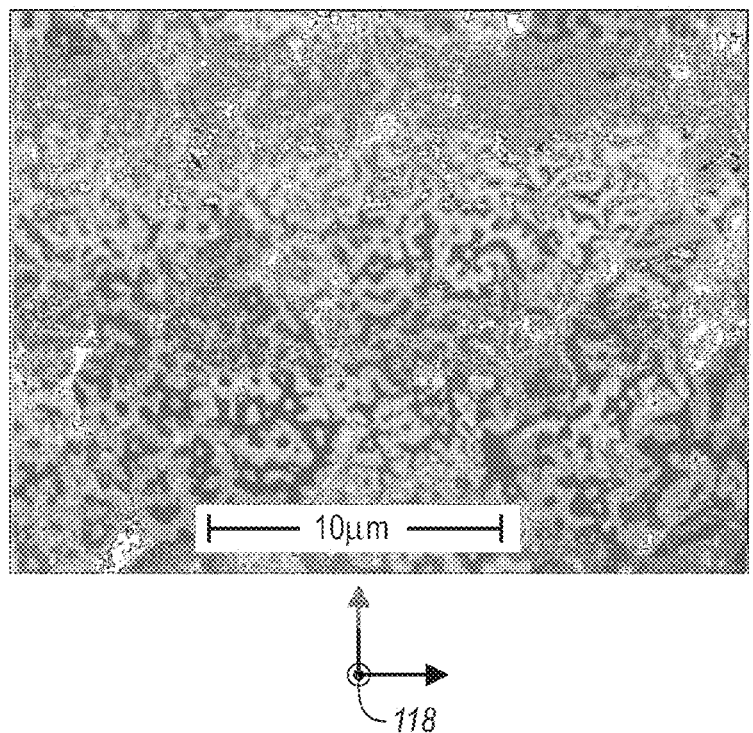

Referring to FIGS. 5A, 5B, and 6, an example of the grain structure of an Mn—Bi alloy produced during experimental magnetic field annealing is illustrated. FIGS. 5A and 5B illustrate enlarged microscopic images of the small grains and the atomic structure of the MnBi LTP alloy along the easy direction. The smaller grains in FIGS. 5A and 5B are hexagonal in shape, which is in coincidence of the crystallographic symmetry of the MnBi LTP phase and is indicative of anisotropic grain growth along the magnetic field direction 118 (i.e., the direction of the magnetic field being applied to the Mn—Bi Ally while being annealed, which is out of the paper in FIGS. 5A, 5B, and 6). FIG. 6 illustrates an enlarged microscopic image of flower-like magnetic domains of the MnBi LTP grains taken in the alignment direction. The flower-like domains are a typical domain structure for permanent magnet surfaces perpendicular to the easy axis. The observations of FIGS. 5A, 5B, and 6 confirm that magnetic field annealing leads to alignment of MnBi LTP grains. The selective grain growth (by setting the duration of the magnetic field annealing) allows for the formation of elongated grains along the field direction 118, which increases coercivity due to shape anisotropy of such elongated grains.

Figure 7:
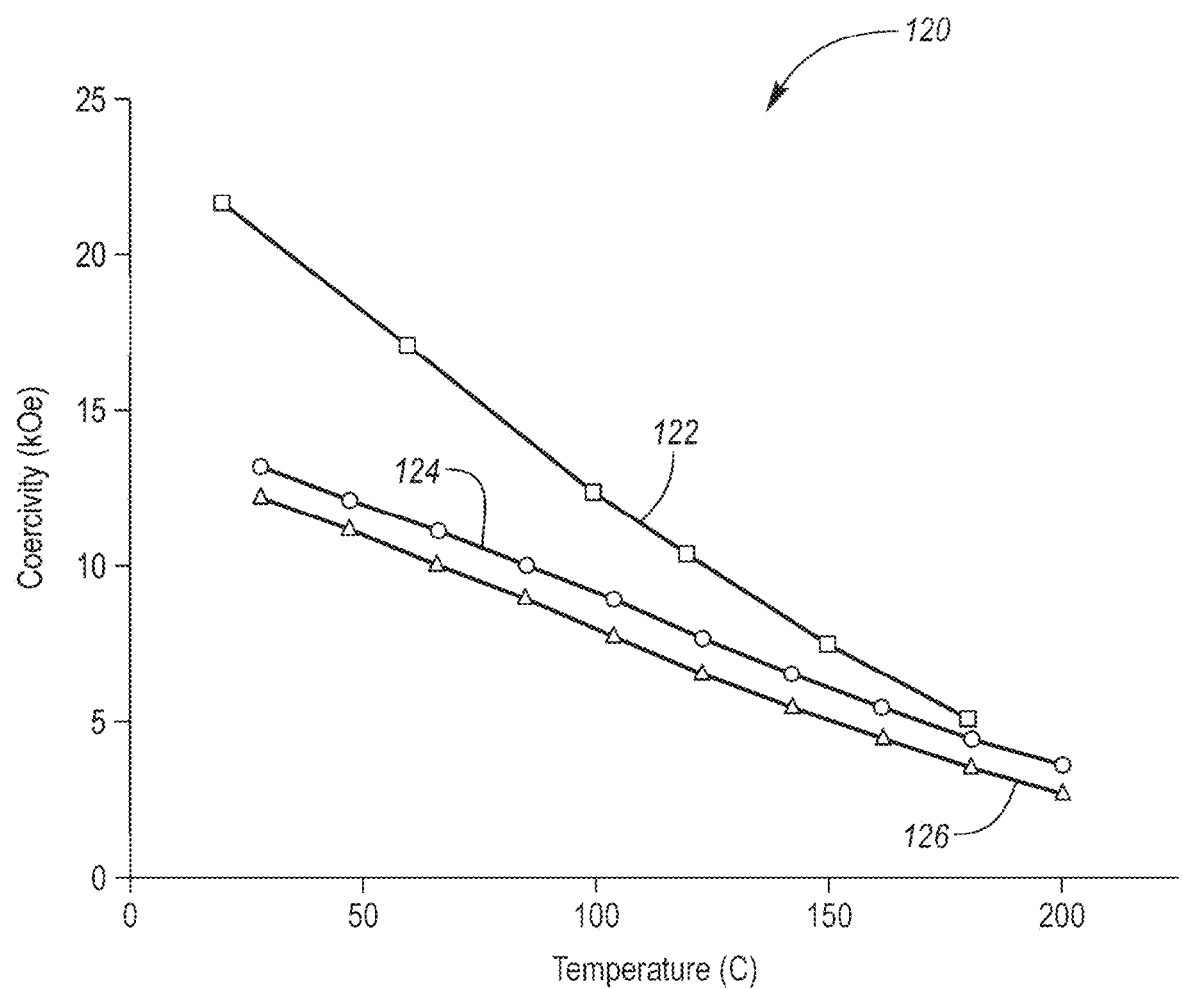
FIGS. 7 illustrates the coercivity of variations of Nd—Fe—B/Mn—Bi permanent magnets relative to a Nd—Fe—B permanent magnet that contains approximately 5% Dysprosium (Dy) by weight.

FIG. 7 illustrates the coercivity of variations of Nd—Fe—B/Mn—Bi permanent magnets relative to a Neodymium-iron-boron/dysprosium (Nd,Dy)—Fe—B permanent magnet. FIG. 7 includes a graph 120 that illustrates the coercivity of the various magnets vs. temperature. The coercivity of the (Nd,Dy)—Fe—B permanent magnet is illustrated by line 122, the coercivity of a Nd—Fe—B/Mn—Bi permanent magnet that was magnetic field annealed is illustrated by line 124, and the coercivity of a Nd—Fe—B/Mn—Bi permanent magnet that was annealed outside of a magnetic field is illustrated by line 126.

The temperature coefficient of coercivity (the rate at which coercivity changes as temperature increases) of both the Nd—Fe—B/Mn—Bi permanent magnet that was magnetic field annealed and the Nd—Fe—B/Mn—Bi permanent magnet that was annealed outside of a magnetic field is smaller in magnitude than the coefficient of coercivity of the conventional sintered (Nd,Dy)—Fe—B magnet, that contains approximately 5% Dy, due to the increasing volume ratio of MnBi LTP during annealing. The coercivity of both the Nd—Fe—B/Mn—Bi permanent magnet that was magnetic field annealed and the Nd—Fe—B/Mn—Bi permanent magnet that was annealed outside of a magnetic field decreases slower than that of the sintered (Nd,Dy)—Fe—B magnet as temperature increases. The Nd—Fe—B/Mn—Bi permanent magnet that was magnetic field annealed has higher coercivity when compared with Nd—Fe—B/Mn—Bi permanent magnet that was annealed outside of a magnetic field. Although the coercivity of the Nd—Fe—B/Mn—Bi permanent magnet that was magnetic field annealed is lower than that of the sintered (Nd,Dy)—Fe—B magnet at room temperature (approximately 25° C.), due to higher thermal stability, the coercivity of the Nd—Fe—B/Mn—Bi permanent magnet that was magnetic field annealed is approximately the same as that of the sintered (Nd,Dy)—Fe—B magnet at 180° C. This proves that field annealing is able to improve the coercivity and the thermal stability of the Nd—Fe—B/Mn—Bi hybrid permanent magnet, allowing the permanent magnet to function at higher temperatures without the addition of heavy rare earth elements.

The words used in the specification are words of description rather than limitation, and it is understood that various changes may be made without departing from the spirit and scope of the disclosure. As previously described, the features of various embodiments may be combined to form further embodiments that may not be explicitly described or illustrated. While various embodiments could have been described as providing advantages or being preferred over other embodiments or prior art implementations with respect to one or more desired characteristics, those of ordinary skill in the art recognize that one or more features or characteristics may be compromised to achieve desired overall system attributes, which depend on the specific application and implementation. As such, embodiments described as less desirable than other embodiments or prior art implementations with respect to one or more characteristics are not outside the scope of the disclosure and may be desirable for particular applications.

What is claimed is:

1. A method comprising:
    mixing a Mn—Bi alloy with a Nd—Fe—B alloy powder having Nd—Fe—B anisotropic particles to form a mixture;
    pressing the mixture within a first magnetic field to form a magnet having Nd—Fe—B anisotropic particles aligned with a magnetic moment of the magnet; and
    annealing the magnet within a second magnetic field to form elongated Mn—Bi grains and align the elongated Mn—Bi grains with the moment, wherein the annealing is performed at a temperature that is greater than the Curie temperature of Nd—Fe—B but less than the Curie temperature of Mn—Bi, wherein the annealing is performed at a temperature that ranges from 360° C. to 447° C.

2. The method of claim 1, wherein the pressing is performed at a temperature that is less than the Curie temperature of Nd—Fe—B.

3. The method of claim 2, wherein the pressing is performed at a temperature of 300° C. or less.

4. The method of claim 1, wherein the annealing is performed for a duration that ranges from 5 minutes to 4 hours.

5. The method of claim 1, wherein the elongated Mn—Bi grains are comprised of MnBi low temperature phase (LTP).

6. The method of claim 1, wherein the annealing increases a length of the Mn—Bi grains in a direction of the moment.

7. The method of claim 6, wherein a ratio of the length of the Mn—Bi grains to a width of the Mn—Bi grains ranges from 3:2 to 100:1 is formed upon completion of the annealing.

8. A method comprising:
    mixing first and second alloys to form a mixture;
    pressing the mixture within a first magnetic field to form a magnet having anisotropic particles of the first alloy aligned with a magnetic moment of the magnet; and
    heat treating the magnet within a second magnetic field to form elongated grains from the second alloy and align the elongated grains with the moment, wherein the heat treating is performed at a temperature that is greater than the Curie temperature of the first alloy but less than the Curie temperature of the second alloy, and wherein the heat treating is performed at a temperature that ranges from 360° C. to 447° C.

9. The method of claim 8, wherein the pressing is performed at a temperature that is less than the Curie temperature of the first alloy.

10. The method of claim 8, wherein the first alloy is a Nd—Fe—B alloy and the second alloy is a MnBi alloy.

11. The method of claim 10, wherein the elongated Mn—Bi grains are comprised of MnBi LTP.

12. The method of claim 8, wherein the heat treating increases a length of the elongated grains in a direction of the moment.

13. The method of claim 12, wherein a ratio of the length of the elongated grains to a width of the elongated grains ranges from 3:2 to 100:1 is formed upon completion of the heat treating.

* * * * *